United States Patent
Qian et al.

(10) Patent No.: US 11,890,643 B2
(45) Date of Patent: Feb. 6, 2024

(54) PIEZOELECTRIC MICROMACHINED ULTRASONIC TRANSDUCER AND METHOD OF FABRICATING THE SAME

(71) Applicant: Vanguard International Semiconductor Corporation, Hsinchu (TW)

(72) Inventors: You Qian, Singapore (SG); Joan Josep Giner de Haro, Singapore (SG); Rakesh Kumar, Singapore (SG); Jia Jie Xia, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 803 days.

(21) Appl. No.: 16/993,274

(22) Filed: Aug. 14, 2020

(65) Prior Publication Data

US 2022/0048072 A1 Feb. 17, 2022

(51) Int. Cl.
*B06B 1/06* (2006.01)
*B81B 3/00* (2006.01)
*B81C 1/00* (2006.01)

(52) U.S. Cl.
CPC .......... *B06B 1/0666* (2013.01); *B81B 3/0021* (2013.01); *B81C 1/00158* (2013.01); *B81B 2201/0271* (2013.01); *B81B 2203/0127* (2013.01); *B81B 2203/0315* (2013.01); *B81C 2201/014* (2013.01); *B81C 2201/0133* (2013.01)

(58) Field of Classification Search
CPC ........ B06B 1/0666; B06B 1/06; H10N 30/88; H10N 30/883
USPC ......................................... 310/322, 334, 335
See application file for complete search history.

(56) References Cited

U.S. PATENT DOCUMENTS

2005/0179100 A1 8/2005 Barzen
2006/0238067 A1* 10/2006 Dausch ................ B06B 1/0622
   310/311
2015/0165479 A1 6/2015 Lasiter

* cited by examiner

*Primary Examiner* — Derek J Rosenau
(74) *Attorney, Agent, or Firm* — Winston Hsu

(57) ABSTRACT

A PMUT includes a substrate, a stopper, and a multi-layered structure, where the substrate includes a corner, and a cavity is disposed in the substrate. The stopper is in contact with the corner of the substrate and the cavity. The multi-layered structure is disposed over the cavity and attached to the stopper and the multi-layered structure includes at least one through hole in contact with the cavity.

16 Claims, 9 Drawing Sheets

PIEZOELECTRIC MICROMACHINED ULTRASONIC TRANSDUCER AND METHOD OF FABRICATING THE SAME

BACKGROUND OF THE INVENTION

1. Field of the Invention

The present disclosure relates generally to the field of Micro Electro Mechanical Systems (MEMS), and more particularly to a piezoelectric micromachined ultrasonic transducer (PMUT) and a method of fabricating the same.

2. Description of the Prior Art

For the past few decades, micromachined ultrasonic transducers (MUTs) have been subject to extensive research and become an important component in various consumer electronics, such as fingerprint, proximity and gesture sensing. In general, MUTs could be categorized into two major types, capacitive micromachined ultrasonic transducers (CMUTs) or piezoelectric micromachined ultrasonic transducers (PMUTs).For a typical PMUT, the PMUT has a membrane consisting of elastic material, electrodes and piezoelectric material, and the membrane is disposed over a cavity acting as an acoustic resonator to improve acoustic performance of the PMUT. During the operation of the PMUT, an ultrasound wave generated by vibrating the membrane is transmitted from. the PMUT to a target, and then the reflected wave generating after hitting the object could be detected by the PMUT.

Generally, PMUTs typically operate at the membrane's flexural resonant frequency, which is defined by selecting the correct materials, membrane size, and thickness. Thus, good matching of the resonant frequencies of the individual PMUTs is required for proper operation. For a conventional PMUT, the cavity underneath the membrane may be formed by etching the backside of the substrate. The cavity may penetrate the substrate so that an opening of the cavity adjacent to the membrane may be used to define the size (or diameter) of the membrane. However, since the cavity underneath the membrane is formed by etching the backside of the substrate, the opening of the cavity adjacent to the substrate may vary significantly across a wafer and from wafer-to-wafer, which inevitably causes the variation in resonant frequency of each PMUT. Besides, forming the cavity in the substrate by etching the backside of the substrate is time-consuming, which is not suitable for mass production of the PMUTs.

Accordingly, there is a need to provide an improved PMUT with precise control of the sizes of a cavity and a membrane disposed over the cavity and a method of fabricating the same.

SUMMARY OF THE INVENTION

In view of this, it is necessary to provide an improved PMUT and a method of fabricating the same in order to increase the size uniformity of a cavity of the PMUT.

According to one embodiment of the present disclosure, a PMUT includes a substrate, a stopper, and a multi-layered structure. The substrate includes a corner, and a cavity is disposed in the substrate. The stopper is in contact with the corner of the substrate and the cavity. The multi-layered structure is disposed over the cavity and attached to the stopper and the multi-layered structure includes at least one through hole in contact with the cavity.

According to another embodiment of the present disclosure, a method of fabricating a PMUT is disclosed and includes the following steps. First, a substrate is provided, and a stopper in contact with the substrate is formed. Then, a multi-layered structure is formed on the substrate and the stopper. Afterward, at least one through hole penetrating the multi-layered structure is formed. Then, by providing an etchant to the substrate through the at least one through hole, a portion of the substrate is etched to form a cavity, where the stopper is in direct contact with the cavity.

According to the embodiments of the present disclosure, the membrane disposed on the front side of the substrate includes at least one through hole which allows etchant to flow through the through hole and etch the substrate under the membrane. As a result, the cavity may be formed by etching the front side of the substrate. Besides, the stopper disposed under the membrane may be used to define the size of the membrane which could vibrate during the operation of the PMUT. Therefore, the manufacturing cost of the PMUTs would be reduced, and the reliability and electrical performance of the PMUTs would be improved effectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
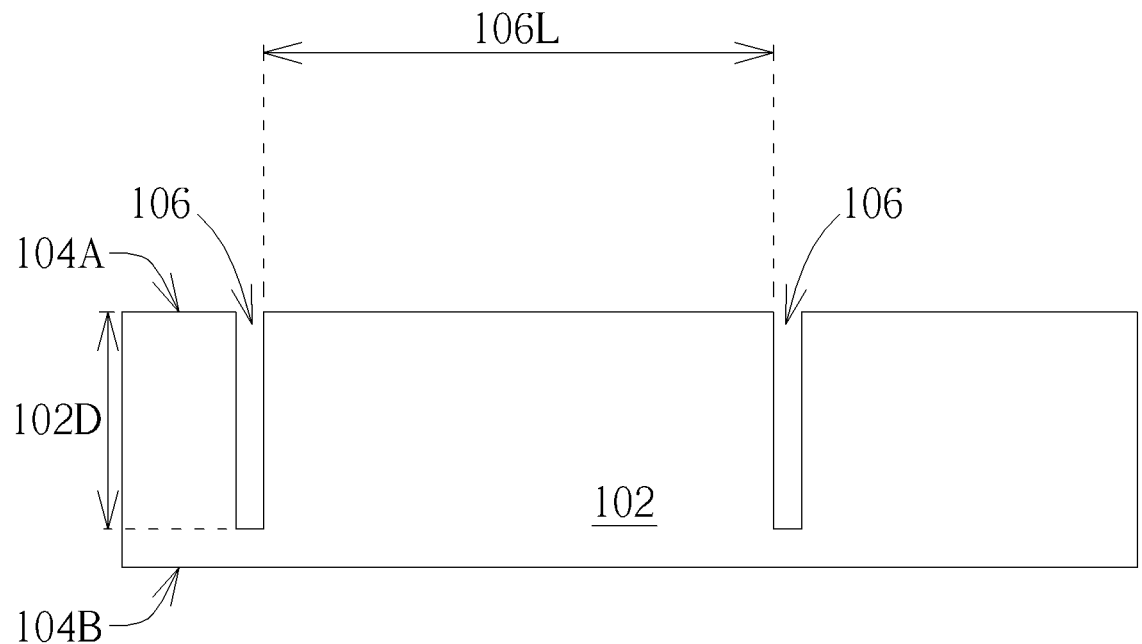
FIG. 1 is a schematic cross-sectional diagram of a structure after trenches are formed in a substrate in accordance with one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature' s relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first, " "second, " and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

It is understood that the specific order or hierarchy of blocks in the following disclosed processes/flowcharts is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the presented specific order or hierarchy.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

In order to enable one of ordinary skill in the art to implement the present disclosure, a method of fabricating a device including a PMUT is described herein. As a PMUT may be fabricated by standard CMOS processes, associated electronics, such as FET, amplifiers, and integrated circuits, may also be fabricated on the same substrate of the PMUT by the same CMOS process.

FIG. 1 is a schematic cross-sectional diagram of a structure after trenches are formed in a substrate in accordance with one embodiment of the present disclosure. Referring to FIG. 1, a substrate 102 having two opposite surfaces, such as a first surface 104A and a second surface 104B, is provided. The substrate 102 may be a semiconductor substrate, such as a crystalline silicon or AlN substrate, and the thickness of the substrate 102 may be 30-600 μm. Trenches 106 may be formed in the substrate 102 by using an anisotropic etching process, such as a reactive ion etching (RIE) . Each trench 106 may be a deep trench with a depth 102D of 10-40 μm, such as 10 μm, 15 μm, 20 μm, 25 μm, 30, 35 μm or 40 μm, and a distance 106L between the two adjacent trenches 106 may be 500 μm to 3 mm. Because the positions of the trenches 106 are precisely defined by a photolithography process, the distance 106L between the trenches 106 may be precisely controlled without deviating from a predetermined value.

Figure 2:
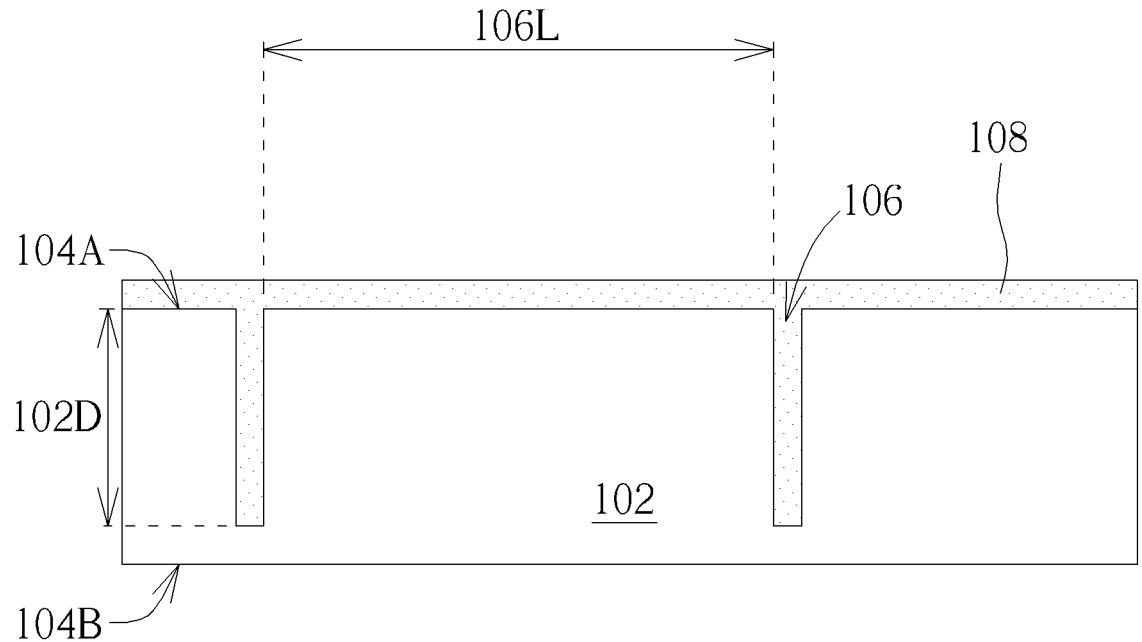
FIG. 2 is a schematic cross-sectional diagram of a structure after depositing a first dielectric layer in trenches with respect to one embodiment of the present disclosure.

FIG. 2 is a schematic cross-sectional diagram of a structure after depositing a first dielectric layer in trenches with respect to one embodiment of the present disclosure. A first dielectric layer 108 made of silicon oxide ($SiO_x$) , silicon nitride ($SiN_x$) , aluminum nitride (AlN) , aluminum oxide ($Al_2O_3$) , other suitable dielectrics, or a combination of thereof may be deposited on the substrate 102 and fills up the trenches 106. According to one embodiment of the present disclosure, the composition of the first dielectric layer 108 is different from the composition of the substrate.

Figure 3:
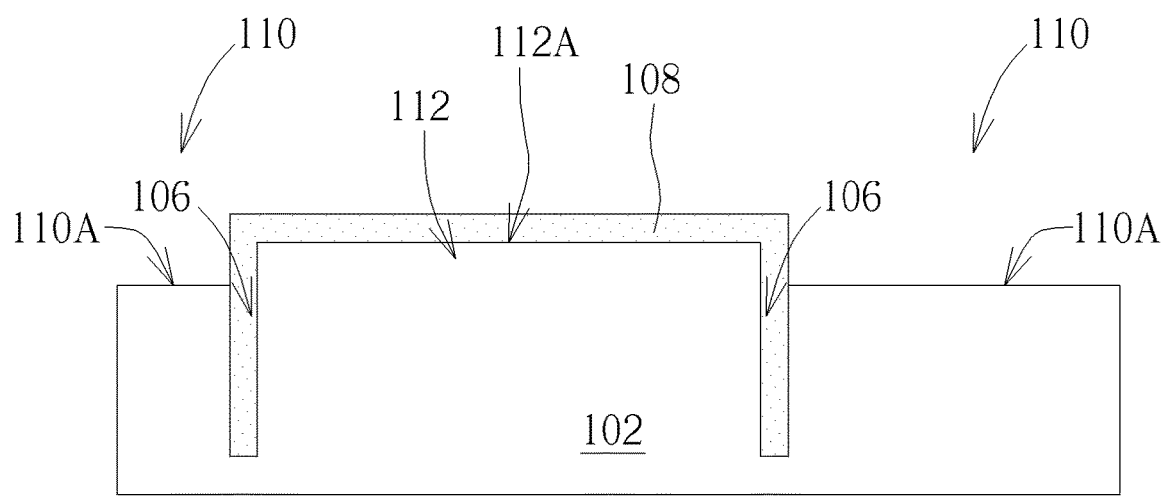
FIG. 3 is a schematic cross-sectional diagram of a structure after forming a recess to expose a dielectric layer in trenches in accordance with one embodiment of the present disclosure.

FIG. 3 is a schematic cross-sectional diagram of a structure after forming a recess to expose a dielectric layer in trenches in accordance with one embodiment of the present disclosure. Referring to FIG. 3, a photolithography and an etching process may be performed to remove a portion of the first dielectric layer 108 and a portion of the substrate 102. When the photolithography and the etching process is completed, recesses 110 may be formed at the outer side of the trenches 106 to expose the first dielectric layer 108 in the trenches 106, and a protruding portion 112 of the substrate 102 may be formed between the two opposite recesses 110. A top surface 110A of the substrate 102 exposed from each recess 110 may be lower than a top surface 112A of the protruding portion 112.

Figure 4:
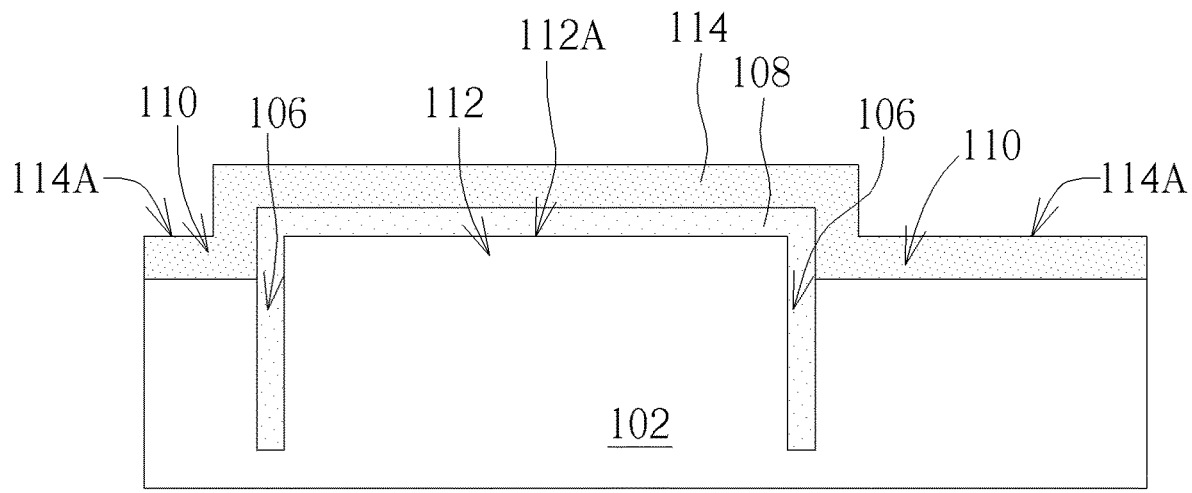
FIG. 4 is a schematic cross-sectional diagram of a structure after depositing a second dielectric layer on a first dielectric layer in accordance with one embodiment of the present disclosure.

FIG. 4 is a schematic cross-sectional diagram of a structure after depositing a second dielectric layer on a first dielectric layer in accordance with one embodiment of the present disclosure. After the process shown in FIG. 3, a second dielectric layer 114 made of silicon oxide ($SiO_x$), silicon nitride ($SiN_x$), aluminum nitride (AlN), aluminum oxide ($Al_2O_3$), other suitable dielectrics, or a combination of thereof may be deposited on the first dielectric layer 108 and fills into the recesses 110. According to one embodiment of the present disclosure, the composition of the second dielectric layer 114 may be the same as the composition of the first dielectric layer 108. Besides, a top surface 114A of the second dielectric layer 114 at the outer side of the trenches 106 may be level with or higher than the top surface 112A of the protruding portion 112.

Figure 5:
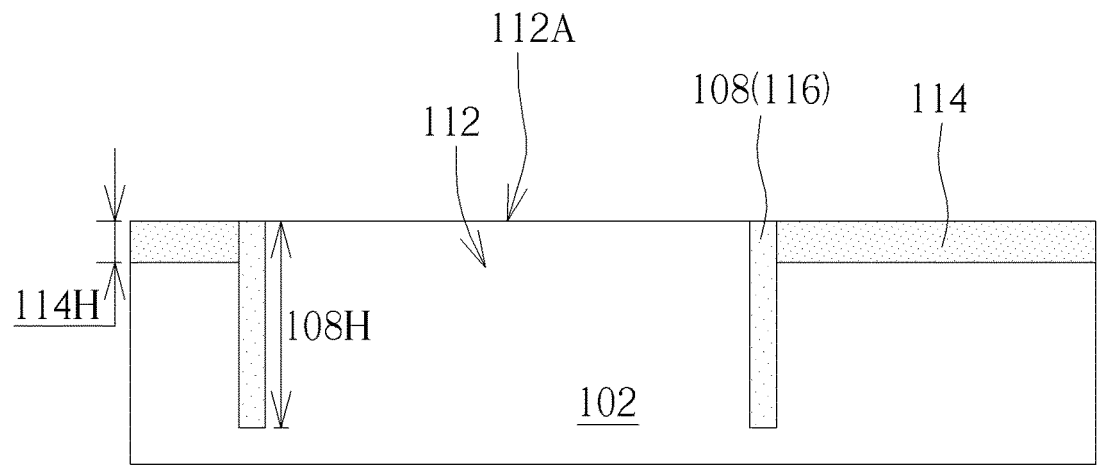
FIG. 5 is a schematic cross-sectional diagram of a structure after planarizing first and second dielectric layers disposed on a substrate in accordance with one embodiment of the present disclosure.

FIG. 5 is a schematic cross-sectional diagram of a structure after planarizing first and second dielectric layers disposed on a substrate in accordance with one embodiment of the present disclosure. Referring to the FIG. 5, a planarization process, such as a chemical mechanical planarization (CMP) process, may be performed to planarize the top surfaces of the protruding portion 112, the first dielectric layer 108, and the second dielectric layer 114. When the planarization process is completed, the height 108H of the first dielectric layer 108 may be greater than the height 114H of the second dielectric layer 114. Besides, the first dielectric layer 108 may function as a stopper 116 used to define the position of the cavity formed in the following processes.

Figure 6:
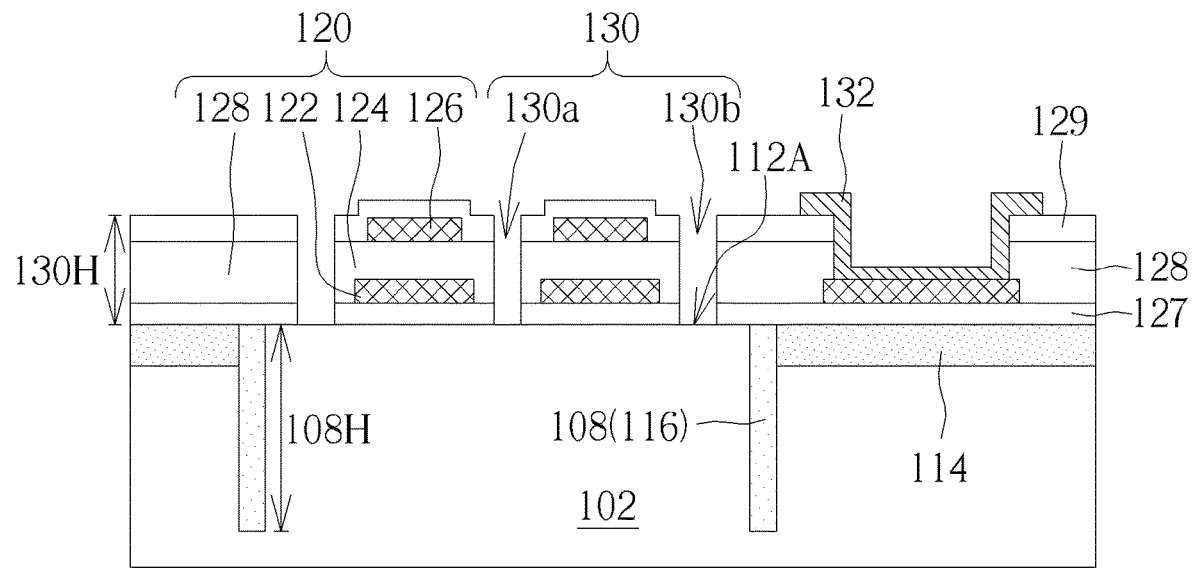
FIG. 6 is a schematic cross-sectional diagram after a multi-layered structure is formed on a substrate in accordance with one embodiment of the present disclosure.

FIG. 6 is a schematic cross-sectional diagram after a multi-layered structure is formed on a substrate in accordance with one embodiment of the present disclosure. Referring to FIG. 6, an optional seeding layer 127, a bottom electrode 122, a piezoelectric layer 124, a piezoelectric layer 128, a top electrode 126, and a passivation layer 129 may be deposited on the substrate 102 and the first dielectric layer 108, which form a multi-layered structure 120 on the substrate 120. The piezoelectric layer 128 may be made of piezoelectric material, such as AlN, scandium doped AlN (AlScN), lead zirconate titanate (PZT), zinc oxide (ZnO), polyvinylidene fluoride (PVDF), or lead mangnesium niobate-lead titanate (PMN-PT), but not limited thereto. According to one embodiment of the present disclosure, the piezoelectric layer 128 may have the same composition as the piezoelectric layer 124 when the piezoelectric layer 128 and the piezoelectric layer 124 are formed in the same deposition process, but not limited thereto. The optional seeding layer 127, such as $SiO_2$, SiON, AlN, or scandium doped AlN (AlScN) may be disposed between the bottom electrode 122 and the substrate 102. The surface texture of the optional seeding layer 127 may affect the crystallinity of the layers deposited thereon. The bottom electrode 122 and the top electrode 126 may be the same or different material composed of molybdenum (Mo), titanium (Ti), aluminum (Al), or platinum (Pt), but not limited thereto. The piezoelectric layer 124 may be composed of aluminum nitride (AlN), scandium doped aluminum nitride (AlScN), lead zirconate titanate (PZT), zinc oxide (ZnO), polyvinylidene fluoride (PVDF), lead mangnesium niobate-lead titanate (PMN-PT), but not limited thereto. The passivation layer 129 may be used to passivate and/or protect the underlying piezoelectric layers 124 and 128 and top electrode 126, and may be made of insulating material or piezoelectric material. According to some embodiments of the present disclosure, the passivation layer 129 may be made of $SiO_2$, SiON, AlN, AlScN, PZT, ZnO, PVDF, PMN-PT, but not limited thereto.

Besides, at least one conducting pad 132 is formed in the piezoelectric layer 128 and electrically coupled to the bottom conductive layer 122 and the top conductive layer 126. After the formation of the multi-layered structure 120, at least one through hole 130, for example through holes 130a and 130b, having a height 130H may be formed in the multi-layered structure 120 to expose the top surface 112A of the protruding portion 112 from the bottoms of the through holes 130. According to one embodiment of the present disclosure, the height of the stopper 116 is greater than ½ of the average height of the through holes 130, such as twice greater than the average height of the through holes 130.

Figure 7:
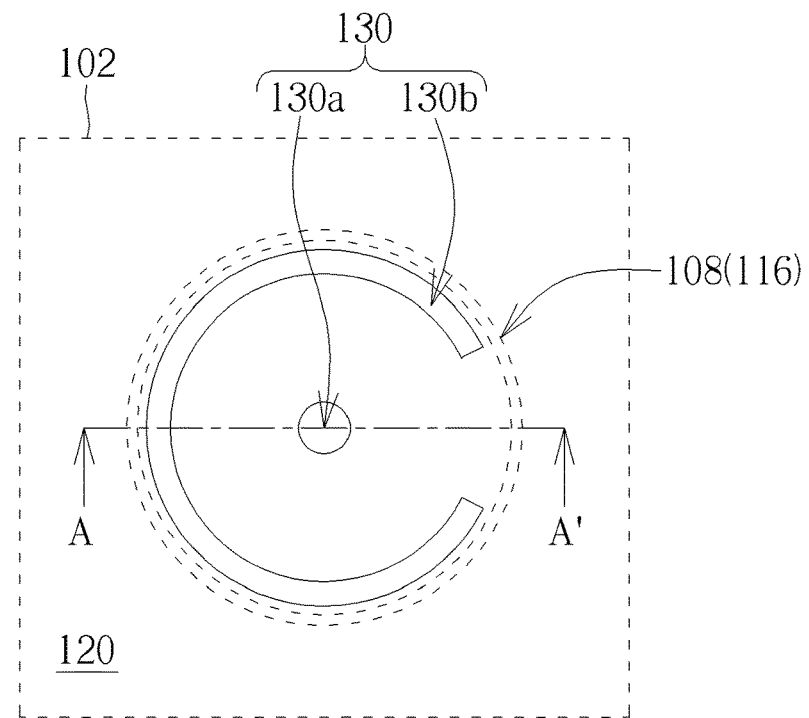
FIG. 7 is a schematic top view of a structure having through holes in a multi-layered structure in accordance with one embodiment of the present disclosure.

Although it seems that the through holes 130 are separated from one another according to the structure shown in FIG. 6, some of the through holes 130 may be connected with one another to thereby constitute a continuous pattern, such as a ring-shaped slot, a ring-shaped slot, a polygon-shaped slot, or an arc-shaped slot, when the structure shown in FIG. 6 is viewed in a top-down perspective. FIG. 7 is a schematic top view of a structure having through holes in a multi-layered structure, where FIG. 6 is taken along a line A-A' in FIG. 7. Referring to FIG .7, the through holes 130 include a circular through hole 130a at the center and a ring-shaped through hole 130b surrounding the circular through hole 130a. Besides, the stopper 116 shown in FIG. 6 may be a continuous structure disposed along the circumference of the ring-shaped through hole 130b.

Figure 8:
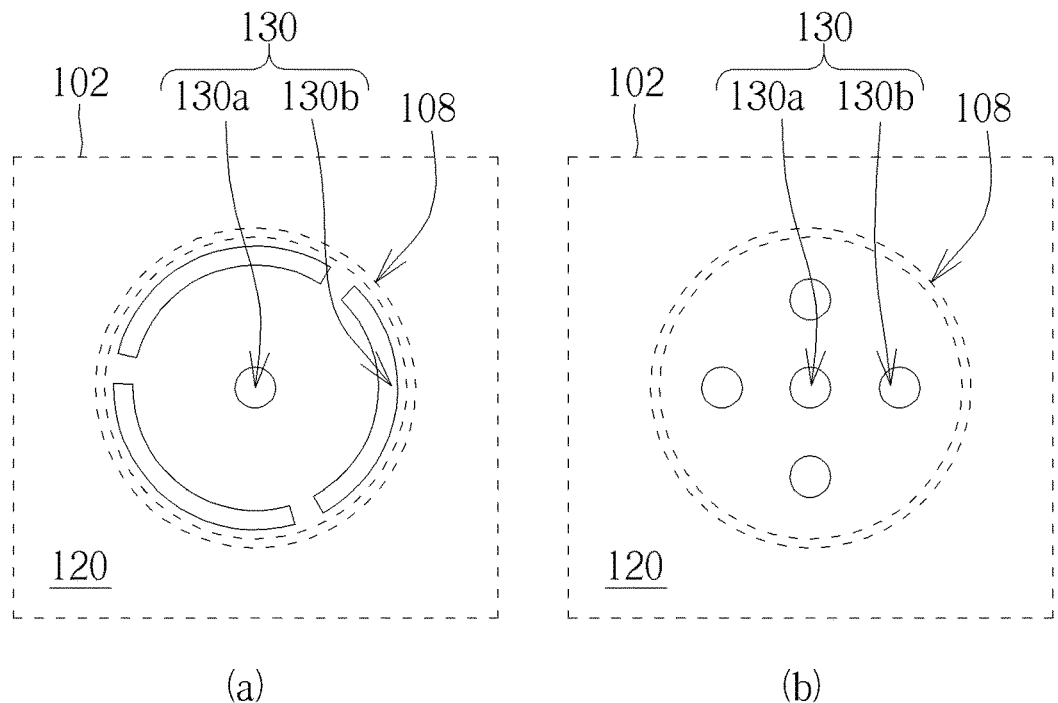
FIG. 8 is a schematic top view of a structure having through holes in a multi-layered structure in accordance with one embodiment of the present disclosure.

The shapes of the through holes 130 are not limited to the shapes shown in FIG. 7. For example, referring to FIG. 8(a), the through holes 130 include a circular through hole 130a at the center and several separate arc-shaped through holes 130b disposed around the circular through hole 130a. Besides, referring to FIG. 8(b), all the through holes 130 are circular through holes 130a and 130b randomly or orderly distributed in the multi-layered structure 120.

Figure 9:
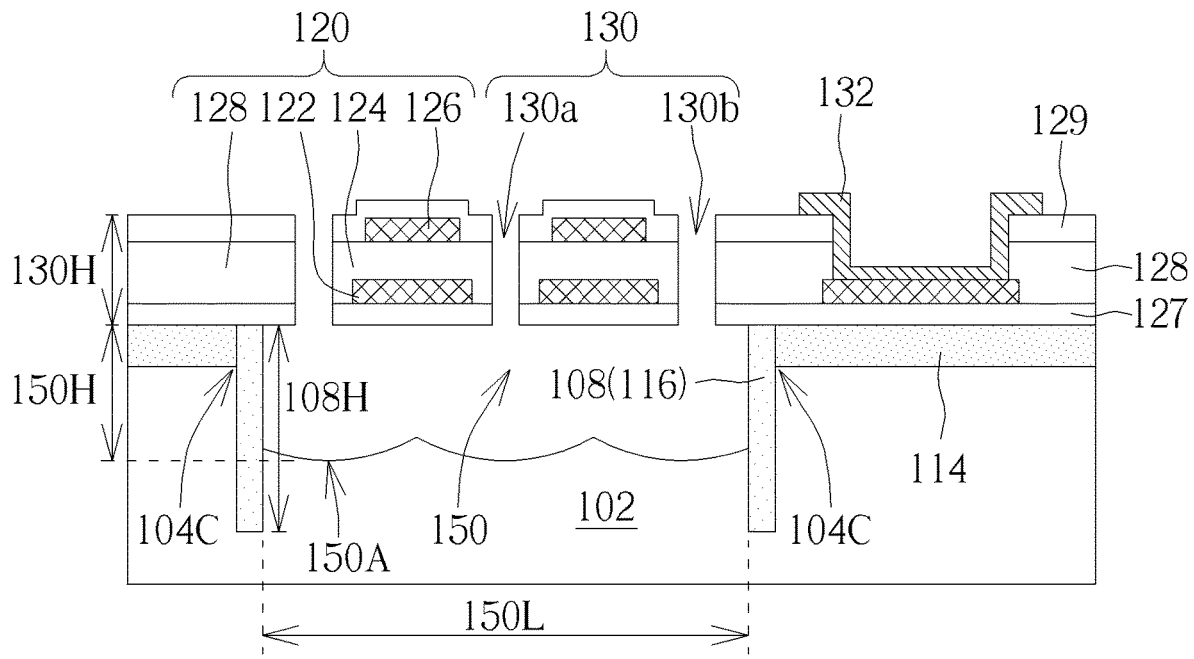
FIG. 9 is a schematic cross-sectional diagram of a structure after a cavity is formed in a substrate in accordance with one embodiment of the present disclosure.

FIG. 9 is a schematic cross-sectional diagram of a structure after a cavity is formed in a substrate in accordance with one embodiment of the present disclosure. Referring to FIG. 9, a cavity 150 with a predetermined diameter 150L may be formed by etching the front side of the substrate 102. The etching process may include the step of providing etchant through the through holes 130 to the substrate 102 until the bottom surface 150A of the cavity 150 reaches a certain depth 150H of 5-35 μm, such as 5 μm, 10 μm, 15 μm, 20 μm, 25 μm, 30, or 35 μm, but not limited thereto. According to one embodiment of the present disclosure, the etchant may be sulfur hexafluoride ($SF_6$) when the stopper 116 is made of silicon oxide and the substrate 102 is made of silicon. Since an etch selectivity of the substrate 102 to the stopper 116 and the optional seeding layer 127 of the multi-layered structure 120 is greater than 10 during the etching process, only the substrate 102 in direct contact with the etchant and not protected by the stopper 116 would be etched away. In other words, during the step of forming the cavity 150 in the substrate 102, the etchant may be confined in a region defined by the stopper 116. According to one embodiment of the present disclosure, an inner sidewall of the stopper 116 is coincident with a sidewall of the cavity 150. Besides, the bottom surface 150A of the cavity 150 is higher than the bottom surface of the stopper 116 so that the lower portions of the stopper 116 may remain embedded in the substrate 102. Besides, after the formation of the cavity 150, at least a corner 104C of the substrate 102 is in proximity to the bottom surface of the multi-layered structure 120, and the corner 104C of the substrate 102 may be in direct contact with the stopper 116. According to one embodiment of the present disclosure, the top surface of the stopper 116 is higher than the highest point of the corner 104C of the substrate 102.

Figure 10:
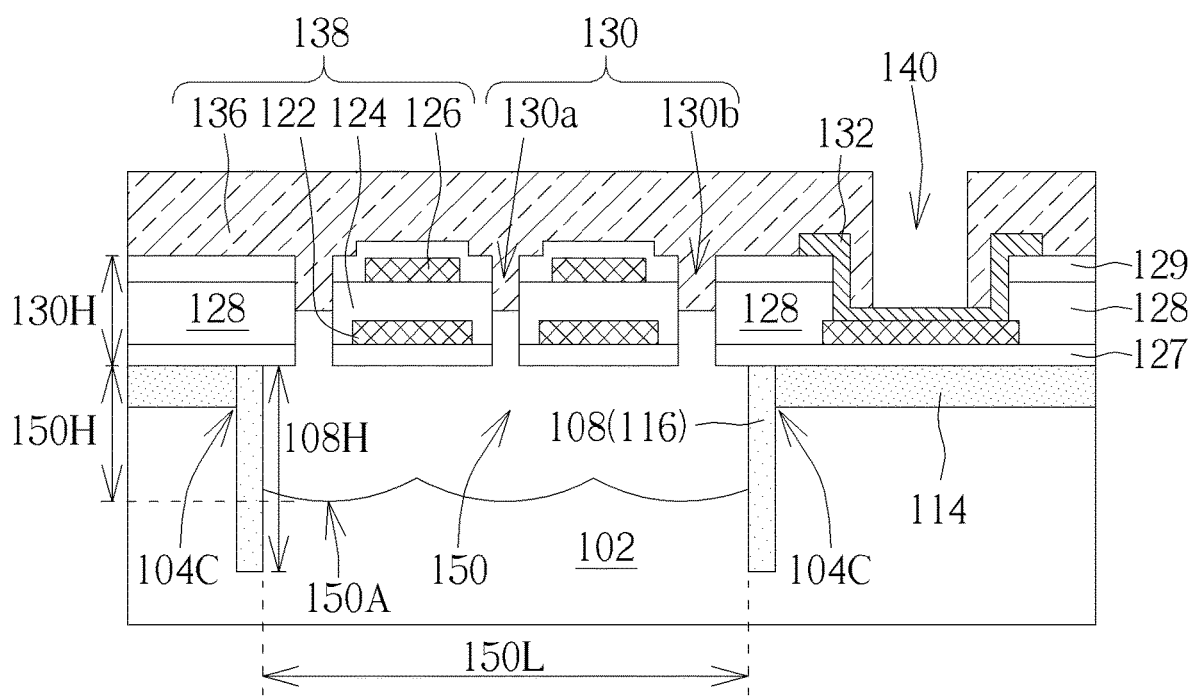
FIG. 10 is a schematic cross-sectional diagram of a structure after a dielectric layer is filled into through holes in accordance with one embodiment of the present disclosure.

FIG. 10 is a schematic cross-sectional diagram of a structure after a dielectric layer is filled into through holes in accordance with one embodiment of the present disclosure. Referring to FIG. 10, a dielectric layer 136 with required elasticity (also called an elastic layer) may be formed on the multi-layered structure and filled into the through holes 130 in order to mechanically support the multi-layered structure and adjust resonance frequency of the corresponding PMUT. Thus, a membrane 138 containing at least the bottom electrode 122, the piezoelectric layer 124, the top electrode 126, and the dielectric layer 136 may be obtained. Because the diameter or dimension of each through hole 130 is small enough (such as 10-300 nm), the upper portion of each through hole 130 may be easily blocked or sealed by the dielectric layer 136 during the deposition of the dielectric layer 136. Thus, the dielectric layer 136 may not be deposited in the cavity 150. Besides, the dielectric layer 136 may function as a protection layer covering portions of the conducting pad 132. A contact hole may be further formed in the dielectric layer 136 to expose portions of the conducting pad 132. Additional conductive traces (not shown) may be electrically coupled to the conducting pad 132 so as to transmit electrical signals into or out of the membrane 138. It should be noted that, according to one embodiment of the present disclosure, the mechanical behavior of the membrane 138 is mainly dominated by the dielectric layer 136 of the membrane 138 because the thickness or elasticity of the stacking layer disposed under the dielectric layer 136 is much less than the thickness or elasticity of the dielectric layer 136.

During the operation of the PMUT, the membrane 138 suspended over the cavity 150 may vibrate when acoustic waves exerts acoustic pressure on the membrane 138 or when external electrical signals are applied to the membrane 138. By using the stopper 116, the dimension and position of the membrane 138 suspended over the cavity 150 may be precisely defined, and the cavity 150 may be formed by etching the front side of the substrate 102. Accordingly, the uniformity of the resonant frequency of each PUMT may be improved, and the time required to form the cavity may also be reduced.

Figure 11:
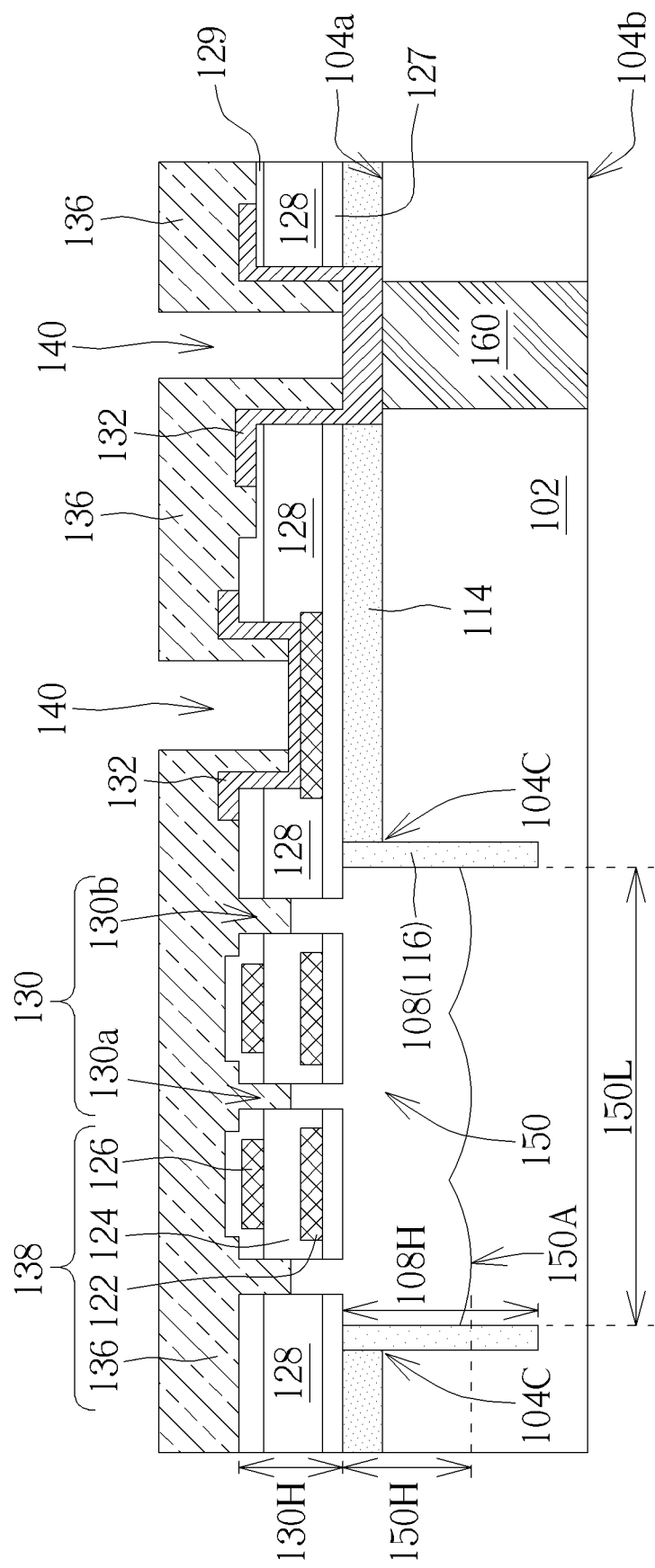
FIG. 11 is a schematic cross-sectional diagram of a structure having a TSV in a substrate in accordance with one embodiment of the present disclosure.

According to some embodiments of the present disclosure, other electronic components, such as a conducting pad or a through silicon via (TSV), may also be formed on or in the substrate 102. FIG. 11 is a schematic cross-sectional diagram of a structure having a TSV in a substrate in accordance with one embodiment of the present disclosure. Referring to FIG. 11, a TSV 160 may be formed through the substrate 102 so that two ends of the TSV 160 may be respectively exposed from the first surface 104a and the second surface 104b of the substrate 102. Besides, there are two conducting pads 132 disposed on the substrate 102. One of the conducting pads 132 may be electrically coupled to the electrode of the PMUT, while the other one of the conducting pads 132 may be partially formed in the second dielectric layer and electrically coupled to the TSV 160.

Figure 12:
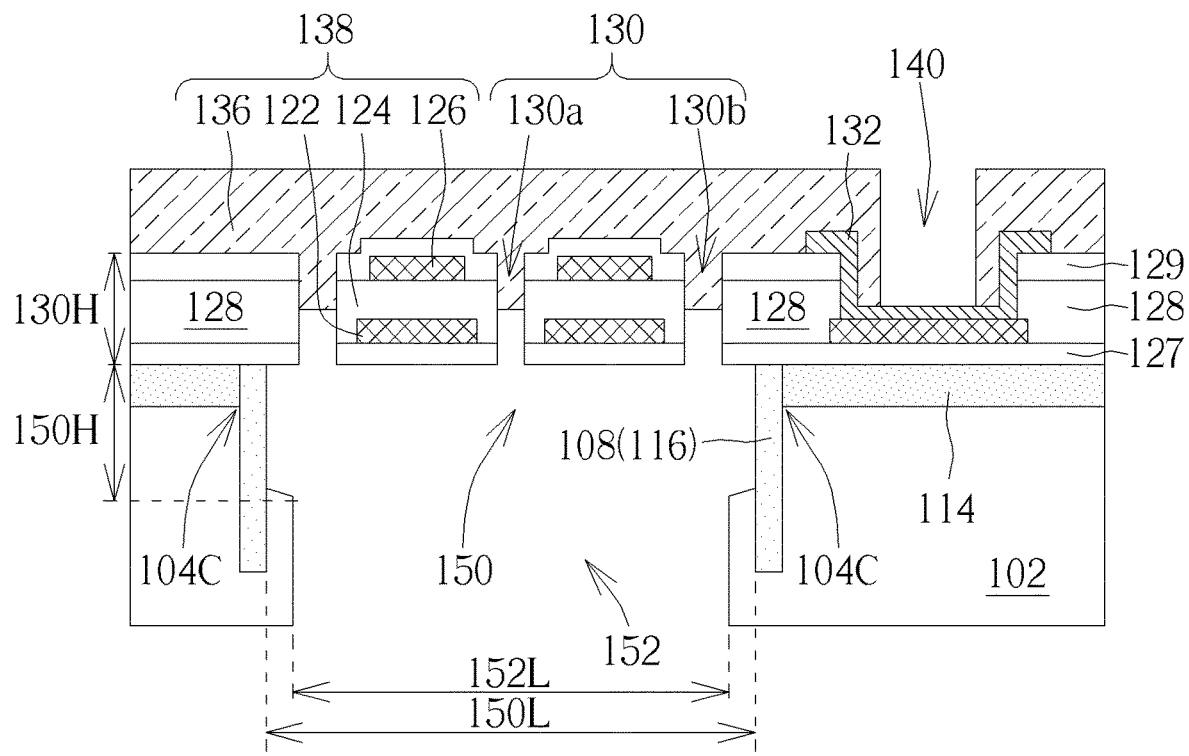
FIG. 12 is a schematic cross-sectional diagram of a structure having a cavity through a substrate in accordance with one embodiment of the present disclosure.

According to another embodiment of the present disclosure, an additional photolithography and etching processes may be performed on the backside of the substrate 102 shown in FIG. 10 so as to form another cavity under the cavity 150. FIG. 12 is a schematic cross-sectional diagram of a structure having a cavity through a substrate in accordance with one embodiment of the present disclosure. Referring to FIG. 12, another cavity 152 may be further formed under the cavity 150 by etching the backside of the substrate 102. The shape of the cavity 152 may be designed based on the shape of the cavity 150. However, the diameter 152L of the cavity 152 may be slightly less than the diameter 150L of the cavity 150. For example, in a case where the cavity 150 is a circle with the diameter of 1 mm when viewed from a top-down perspective, the cavity 152 may also be a circle but with a relatively small diameter, such as 0.8 mm.

The method of fabricating the stopper is not limited to the embodiments above. According to some embodiments of the present disclosure, the stopper may also be fabricated by the processes shown in FIG. 13 and FIG. 14.

Figure 13:
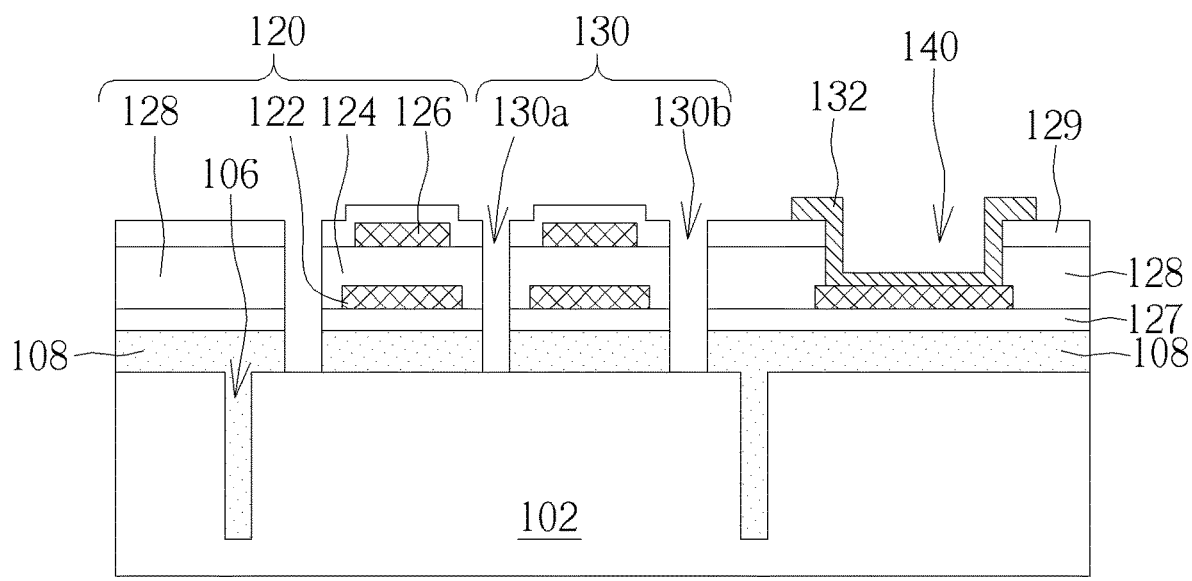
FIG. 13 is a schematic cross-sectional diagram of a structure with a dielectric layer having at least one through hole in accordance with one embodiment of the present disclosure.

FIG. 13 is a schematic cross-sectional diagram of a structure with a dielectric layer having at least one through hole in accordance with one embodiment of the present disclosure. Referring to FIG. 13, the structure shown in FIG. 12 may be fabricated by the processes shown in FIG. 1-FIG. 6. However, the first dielectric layer 108 shown in the embodiment of FIG. 13 is not only filled into the trenches 106 but also disposed between the multi-layered structure 120 and the substrate 102. Therefore, the entire multi-layered structure 120 may be separated from the substrate 102 by the first dielectric layer 108. Besides, the at least one through hole 130 may extend into the first dielectric layer 108 so as to expose a portion of a surface of the substrate 102.

Figure 14:
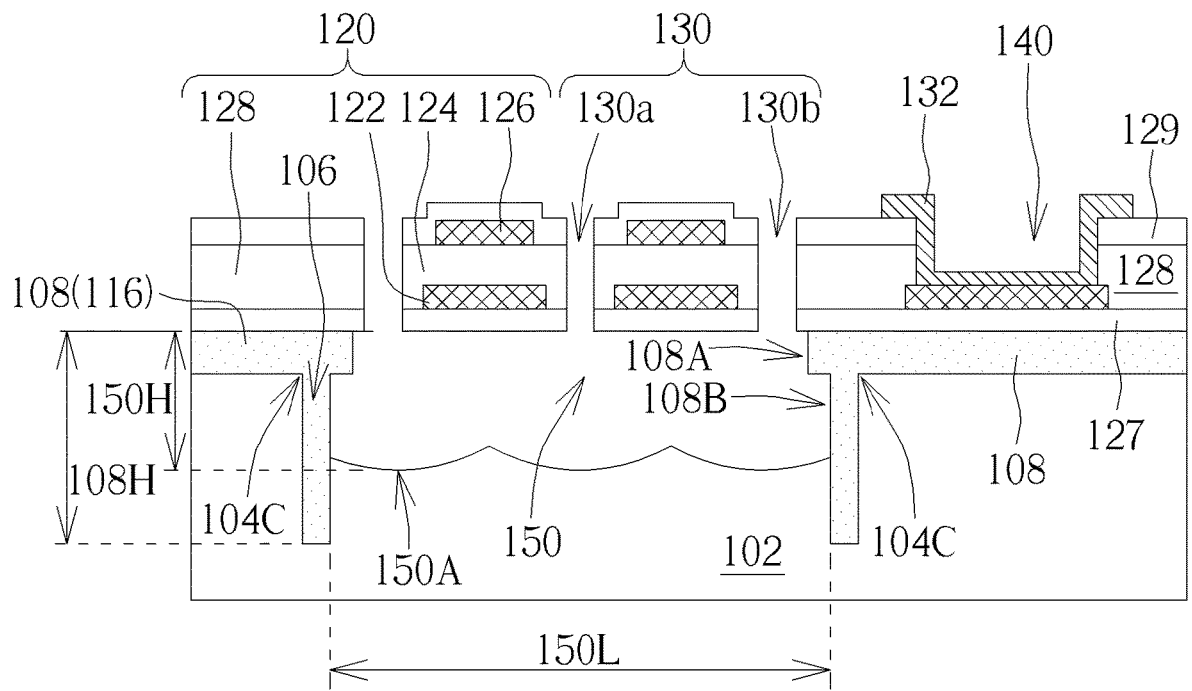
FIG. 14 is a schematic cross-sectional diagram of a structure after a cavity is formed in a substrate in accordance with one embodiment of the present disclosure.

FIG. 14 is a schematic cross-sectional diagram of a structure after a cavity is formed in a substrate in accordance with one embodiment of the present disclosure. Referring to FIG. 14, an etching process for forming a cavity 150 in the substrate 102 may be similar to the process according to the embodiment of FIG. 9. However, according to the embodiment of FIG. 14, the etchant may etch not only the substrate 102 but also the first dielectric layer 108 disposed under the multi-layered structure 120. Thus, when the etching process is completed, the dielectric layer 108 over the cavity 150 may be removed completely, thereby exposing the bottom surface of the multi-layered structure 120 over the cavity 150. Besides, an upper sidewall 108A of the stopper 116 may be misaligned with a lower sidewall 108B of the stopper 116 when the etching process is completed, but not limited thereto.

Figure 15:
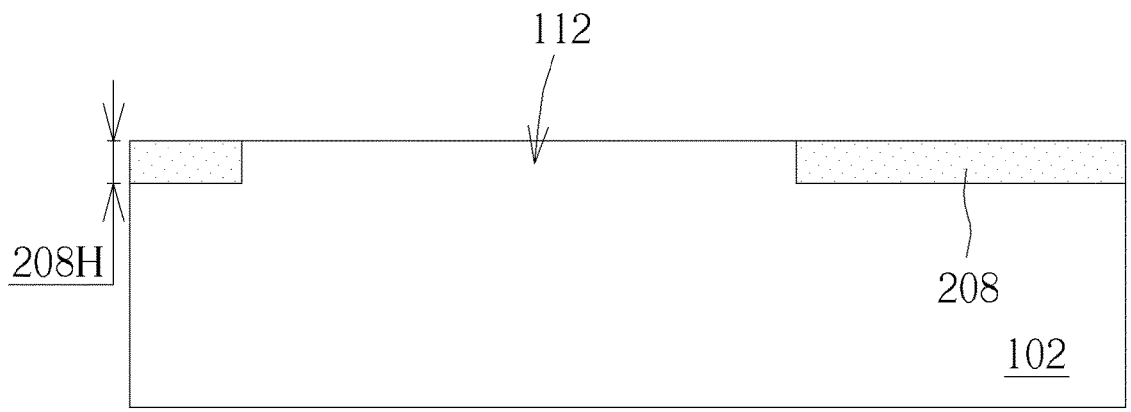
FIG. 15 to FIG. 17 show a method of fabricating a device including a PMUT according to one embodiment of the present disclosure.
Figure 16:
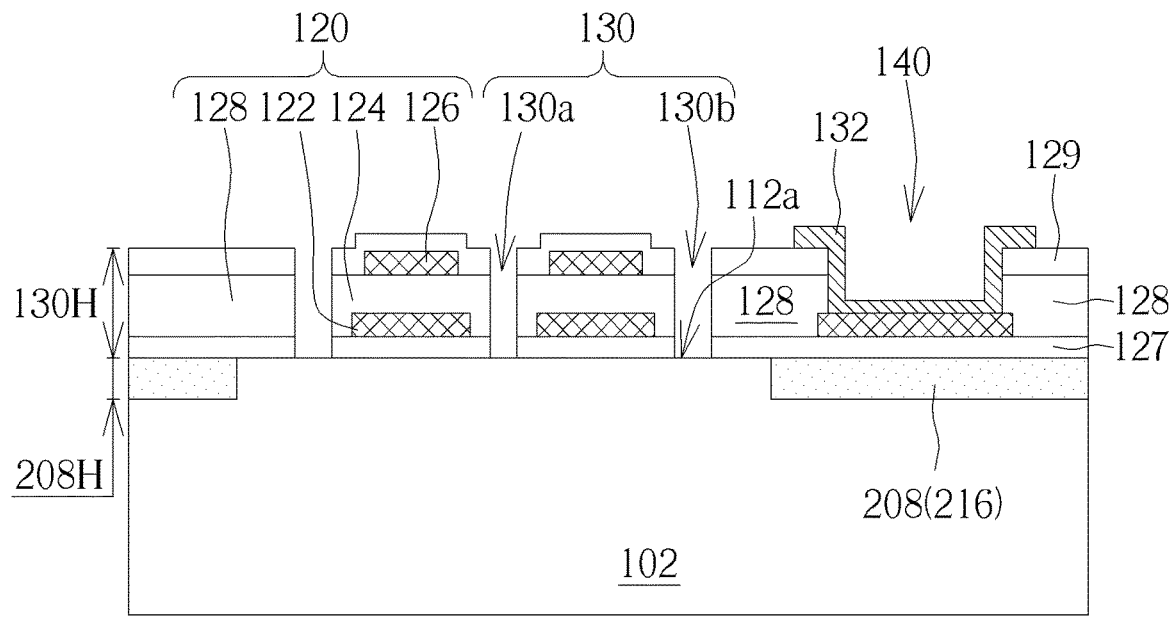
Figure 17:
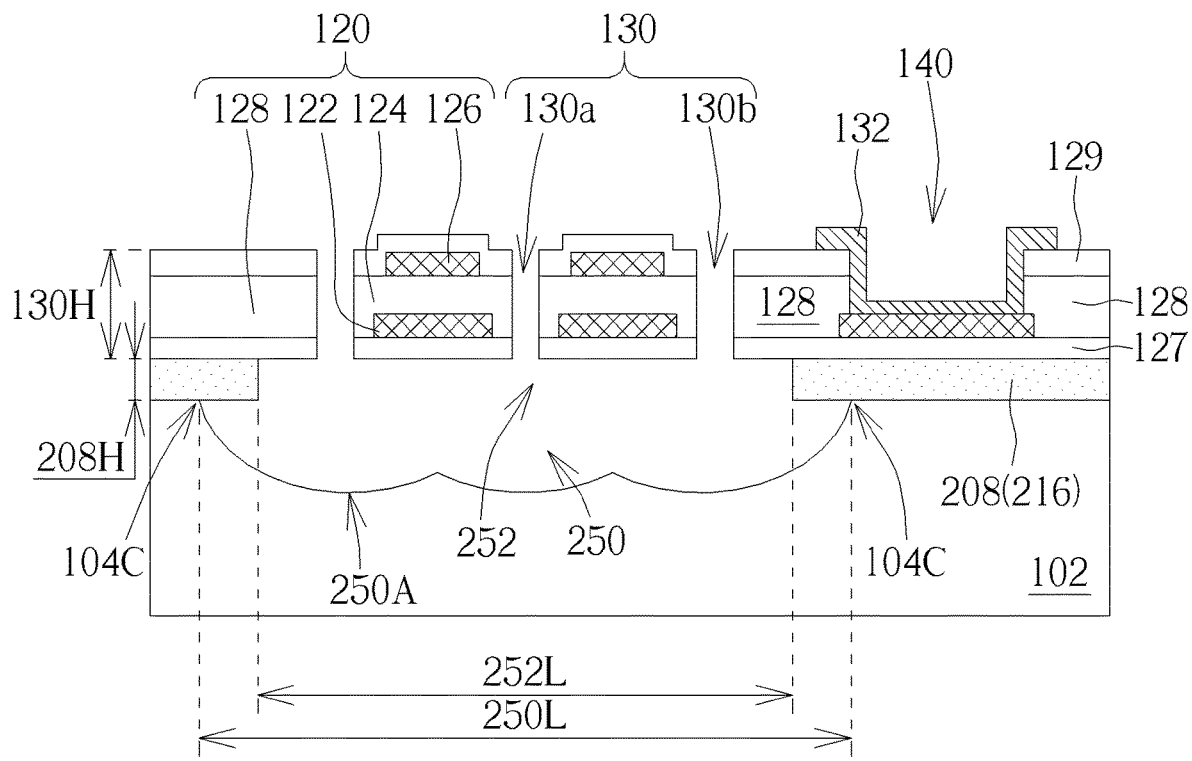

FIG. 15 to FIG. 17 show a method of fabricating a device including a PMUT according to one embodiment of the present disclosure. Referring to FIG. 15, a substrate 102 with a protruding portion 112 may be provided. The substrate 102 may be a semiconductor substrate, such as a crystalline silicon or AlN substrate, and the thickness of the substrate 102 may be 30-600 μm. A dielectric layer 208 made of silicon oxide ($SiO_x$), silicon nitride ($SiN_x$), aluminum nitride (AlN), aluminum oxide ($Al_2O_3$), other suitable dielectrics, or a combination of thereof may be deposited on the substrate 102 to surround the protruding portion 112. The top surface of the dielectric layer 208 may be level with the top surface of the protruding portion 112 by using a CMP process, but not limited thereto. The thickness (or height 208H) of dielectric layer 208 is set to be in a range of 3-15 μm, such as 3 μm, 5 μm, 9 μm, 11 μgm, 11 μm, or 15 μm, but not limited thereto.

Referring to FIG. 16, the structure shown in FIG. 16 may be fabricated by the processes similar to the process shown in FIG. 6. However, there are no trenches formed in the substrate 102, and the dielectric layer 208 disposed on the substrate 102 may function as an etch stopper 216 in the following etching process. Besides, the height 208H of the stopper 216 is greater than ½ of the average height 130H of the through holes 130.

Referring to FIG. 17, the structure shown in FIG. 17 may be fabricated by the processes similar to the process shown in FIG. 9. According to the embodiment of FIG. 17, the etchant may etch not only the substrate 102 between the stoppers 216 but also the substrate 102 under the stopper 216. Besides, two cavities 250 and 252 with different diameters may be formed in the substrate 102. For example, a maximum diameter 250L of the lower cavity 250 may be greater than a maximum diameter 252L of the upper cavity 252. Besides, the sidewall of the stopper 216 may be coincident with the sidewall of the upper cavity 252. Also, the shape of the lower cavity 250 may be formed corresponding to the shape of the upper cavity 252 when viewed from a top-down perspective. For example, in a case where the upper cavity 252 is a circle with the diameter of 1 mm when viewed from a top-down perspective, the lower cavity 250 may also be a circle but with a relatively larger diameter, such as 1.2 mm. Because the thickness (or height 208H) of the stopper 216 is set to be in a range of 3-15 μm, the stopper 216 may be rigid enough even though portions of the stopper 216 are not supported by the substrate 102. As a result, the stopper 216 may not be deformed or vibrated during the operation of the PMUT, and could be used to precisely define the size of the membrane disposed over the cavities 250 and 252.

According to the embodiments of the present disclosure, the multi-layered structure disposed on the front side of the substrate includes at least one through hole which allows etchant to flow through the through hole and etch the substrate under the membrane. As a result, the cavity may be formed by etching the front side of the substrate. Besides, the stopper disposed under the multi-layered structure may be used to define the size of a membrane which could vibrate during the operation of the PMUT. Therefore, the manufacturing cost of the PMUTs would be reduced, and the reliability and electrical performance of the PMUTs would be improved effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A piezoelectric micromachined ultrasonic transducer (PMUT), comprising:
   a substrate comprising a corner;
   a cavity disposed in the substrate and not penetrate through the substrate;
   a stopper being in contact with the corner of the substrate and the cavity; and
   a multi-layered structure disposed over the cavity and attached to the stopper, wherein the multi-layered structure comprises at least one through hole in contact with the cavity.

2. The PMUT of claim 1, wherein a height of the stopper is greater than ½ of a height of the at least one through hole.

3. The PMUT of claim 1, wherein the multi-layered structure comprises at least two electrodes and a piezoelectric layer disposed between the electrodes.

4. The PMUT of claim 1, further comprising a dielectric layer disposed on the multi-layered structure and filled into an upper portion of the at least one through hole.

5. The PMUT of claim 1, wherein a material of the substrate is different from a material of the stopper, and an etch selectivity of substrate to the stopper is greater than 10 when vapor fluoric acid (VHF) is used as etchant.

6. The PMUT of claim 5, wherein the substrate is made of crystalline silicon and the stopper is made of silicon oxide.

7. The PMUT of claim 1, wherein the at least one through hole is a circular hole, a ring-shaped hole, a polygon-shaped hole, or an arc-shaped hole.

8. The PMUT of claim 1, wherein a lower portion of the stopper is embedded in the substrate.

9. The PMUT of claim 1, wherein a bottom surface of the cavity is higher than a bottom surface of the stopper.

10. The PMUT of claim 1, wherein a sidewall of the stopper is coincident with a sidewall of the cavity.

11. The PMUT of claim 1, further comprising a dielectric layer disposed between the substrate and the multi-layered structure, wherein the dielectric layer has the same composition as the stopper.

12. The PMUT of claim 1, further comprising another cavity disposed under and in direct contact with the cavity, wherein a diameter of the another cavity is less than a diameter of the cavity.

13. The PMUT of claim 1, wherein an upper sidewall of the stopper is misaligned with a lower sidewall of the stopper.

14. The PMUT of claim 1, wherein the stopper is extended to cover a top surface of the substrate.

15. The PMUT of claim 1, wherein a portion of the cavity is under the stopper.

16. The PMUT of claim 1, further comprising another cavity over the cavity, wherein a sidewall of the stopper is coincident with a sidewall of the another cavity.

* * * * *